US008257910B1

(12) United States Patent
Guerrero et al.

(10) Patent No.: US 8,257,910 B1
(45) Date of Patent: Sep. 4, 2012

(54) UNDERLAYERS FOR EUV LITHOGRAPHY

(75) Inventors: Douglas J. Guerrero, Rolla, MO (US);
Hao Xu, Camas, WA (US); Vandana Krishnamurthy, Rolla, MO (US)

(73) Assignee: Brewer Science Inc., Rolla, MO (US)

( * ) Notice: Subject to any disclaimer, the term of this patent is extended or adjusted under 35 U.S.C. 154(b) by 436 days.

(21) Appl. No.: 12/491,009

(22) Filed: Jun. 24, 2009

Related U.S. Application Data

(60) Provisional application No. 61/075,218, filed on Jun. 24, 2008.

(51) Int. Cl.
*G03F 7/26* (2006.01)
(52) U.S. Cl. ...................................... 430/322
(58) Field of Classification Search .................. 430/322, 430/311
See application file for complete search history.

(56) References Cited

U.S. PATENT DOCUMENTS

| 6,140,023 A * | 10/2000 | Levinson et al. ............. 430/313 |
| 7,005,227 B2 | 2/2006 | Yueh et al. |
| 2005/0255410 A1 * | 11/2005 | Guerrero et al. ............. 430/311 |
| 2006/0003253 A1 | 1/2006 | Meagley et al. |
| 2008/0081288 A1 * | 4/2008 | Kawanishi et al. ........ 430/281.1 |
| 2010/0173493 A1 * | 7/2010 | Kushibiki et al. ............. 438/694 |

OTHER PUBLICATIONS

Xu et al., "Underlayer designs to enhance the performance of EUV resists," Proc. of SPIE, vol. 7273, 2009, pp. 72731J-1-72731J-11.
Chandhok et al., "Techniques for directly measuring the absorbance of photoresists at EUV wavelengths," Proc. of SPIE, vol. 5374, 2004, p. 861-868.
Wang et al., "Synthesis and Properties of New Anionic Photoacid Generators Bound Polymer Resists for e-beam and EUV lithography," Proc. of SPIE, vol. 6923, 2008, 692312-692312-7.
Brainard et al., "Photons, Electrons, and Acid Yields in EUV Photoresists: A Progress Report," Proc. of SPIE, vol. 6923, 2008, 692325-692325-14.
Fedynyshyn et al., "Polymer Matrix Effects on EUV Acid Generation," Proc. of SPIE, vol. 6923, 2008, 692319-1-692319-12.
Kozawa et al., "Feasibility Study on High-Sensitivity Chemically Amplified Resist by Polymer Absorption Enhancement in Extreme Ultraviolet Lithography," Appl. Phys. Express 1, vol. 067012, 2008, 067012-1-067012-3.
K.E. Holbert, Atomic Number Density, EEE460-Handout, Date unknown, 2 pages.

(Continued)

*Primary Examiner* — Kathleen Duda
*Assistant Examiner* — Caleen Sullivan
(74) *Attorney, Agent, or Firm* — Hovey Williams LLP (57) ABSTRACT

The present invention provides methods of fabricating microelectronics structures and the resulting structures formed thereby using EUV lithographic processes. The method involves utilizing an underlayer immediately below the photoresist layer. The underlayer can either be directly applied to the substrate, or it can be applied to any intermediate layer(s) that may be applied to the substrate. The preferred underlayers are formed from spin-coatable, polymeric compositions. The inventive method allows reduced critical dimensions to be achieved while improving adhesion and reducing or eliminating pattern collapse issues.

35 Claims, 5 Drawing Sheets

OTHER PUBLICATIONS

Gullikson et al., "Recent Developments in EUV Reflectometry at the Advanced Light Source," Proc. of SPIE, vol. 4343, 2001, 4343-91.

Sharma et al., "Enhancing Photoresist Performance with an Adhesion Promoting Photo-Acid Generator," Proc. of SPIE, vol. 6519, 2007, 65190K-1-65190K-10.

Sasaki et al., "Development of partially fluorinated EUV-resist polymers for LER and sensitivity improvement," Proc. of SPIE, vol. 6923, 2008, 692347-1-692347-7.

Meagley et al., "Smart Substrates: Improving Pattern Fidelity with the Gain Enhancing Underlayers, APPAG," Journal of Molecular Science, Part B, 46:1, 2007, pp. 33-41.

Guerrero et al., "Organic Underlayers for EUV Lithography," J. Photopolym. Sci. Technol., vol. 21, No. 3, 2008, pp. 451-455.

Kozawa et al., "Acid distribution in chemically amplified extreme ultraviolet resist," J. Vac. Sci. Technol. B 25(6), Nov./Dec. 2007, pp. 2481-2485.

Dentinger et al., "Photoresist Film Thickness for Extreme Ultraviolet Lithography," Proc. of SPIE, vol. 3997, 2000, 588-599.

Center for X-Ray Optics, Lawrence Berkeley National Laboratory, "Index of Refraction," http://henke.lbl.gov/optical_constants/getdb2.html, 1 page.

Fedynyshyn et al., "Polymer Matrix Effects on EUV Acid Generation," Lincoln Laboratory, Massachusetts Institute of Technology, #Intel Corporation, Jun. 22, 2009, pp. 1-34.

* cited by examiner

UNDERLAYERS FOR EUV LITHOGRAPHY

RELATED APPLICATIONS

This application claims the priority benefit of a provisional application entitled UNDERLAYERS FOR EUV LITHOGRAPHY, Ser. No. 61/075,218, filed Jun. 24, 2008, incorporated by reference herein.

BACKGROUND OF THE INVENTION

1. Field of the Invention

The present invention relates in general to methods of fabricating microelectronic structures using EUV (extreme ultraviolet) lithography.

2. Description of the Prior Art

As device generations continue toward the 22-nm node, EUV lithography is expected to be the method of choice to achieve the required critical dimension (CD) targets. One of the main challenges in material design, particularly with resists, is achieving the improvement in line width roughness (LWR) and sensitivity necessary to achieve industry targets. The International Technology Roadmap for Semiconductors has set targets for 3G LWR at <3 nm and for sensitivity at <10 mJ/cm$^2$. Most currently available resists do not meet both targets and tend to achieve a compromise between LWR and sensitivity.

Numerous attempts have been made to improve resist sensitivity while improving LWR. Among the various approaches is incorporating a photoacid generator (PAG) functionality into the resist polymer. Such methods are limited to the maximum or minimum amount of PAG that must be present in the polymer formulation for optimum lithographic performance. It is also synthetically challenging to obtain the ideal PAG composition for incorporation into a polymer backbone.

In another approach for resist design, halogens have been used in an attempt to increase resist absorbance to reduce LWR and increase sensitivity. This approach is promising, but the resist needs a certain level of transparency to minimize tapering that can occur at the bottom of the resist. Tapering is caused by the difference in light absorption that occurs as photons travel from the top of the resist to the bottom of the resist.

It has also been suggested that resist absorbance and secondary electron generation by EUV irradiation play an important role in acid generation that can improve LWR and sensitivity. However, as discussed above, there are limitations on the increase in absorbance that can be achieved in a resist film before tapering occurs.

There is a need for improved EUV methods that improve LWR while simultaneously having the necessary sensitivity.

SUMMARY OF THE INVENTION

The present invention provides a method of forming a structure. The method comprises providing a substrate that optionally includes one or more intermediate layers on the substrate. An underlayer is then formed on the substrate, or on any present intermediate layers, with the underlayer having a thickness of at least about 10 nm. A photoresist layer is formed on the underlayer, and at least a portion of the photoresist layer is subjected to RN radiation.

In another embodiment, the present invention provides another method of forming a structure. The method comprises providing a substrate that optionally includes one or more intermediate layers on the substrate. An underlayer is then formed on the substrate, or on any present intermediate layers, with the underlayer being non-conductive. A photoresist layer is formed on the underlayer, and at least a portion of the photoresist layer is subjected to EUV radiation.

DETAILED DESCRIPTION OF THE PREFERRED EMBODIMENTS

The Inventive Method

In more detail, the present invention provides a method of forming a microelectronic structure that is particularly suited for EUV (i.e., 13.5 nm) lithography. In the inventive method, a substrate having a surface is provided. Any microelectronic substrate can be utilized. Preferred substrates include those selected from the group consisting of silicon, SiGe, SiO$_2$, Si$_3$N$_4$, aluminum, tungsten, tungsten silicide, gallium arsenide, germanium, tantalum, and tantalum nitride. The substrate can have a planar surface, or it can include topography features (via holes, trenches, contact holes, raised features, lines, etc.). As used herein, "topography" refers to the height or depth of a structure in or on a substrate surface.

A composition useful for forming an underlayer is then applied to the substrate to form the underlayer on the substrate. The composition can be applied by any known application method, with one preferred method being spin coating the composition at speeds of from about 350 rpm to about 4,000 rpm (preferably from about 1,000 rpm to about 2,500 rpm) for a time period of from about 20 seconds to about 90 seconds (preferably from about 30 seconds to about 60 seconds). The underlayer is then baked to induce thermal crosslinking of the composition to form a cured underlayer. Preferred baking conditions involve temperatures of at least about 145° C., preferably from about 150° C. to about 250° C., and more preferably from about 175° C. to about 210° C., and for a time period of from about 30 seconds to about 120 seconds (preferably from about 45 seconds to about 90 seconds).

The thickness of the underlayer after baking is at least about 10 nm, preferably from about 10 nm to about 70 nm, more preferably from about 12 nm to about 50 nm, and even more preferably from about 15 nm to about 45 nm. If the substrate surface includes topography, the underlayer is preferably applied at a thickness sufficient to substantially cover the substrate topography.

Although the above discusses the application of the underlayer directly to the substrate surface, it will be appreciated that in some embodiments there may be one or more intermediate layers applied to the substrate first. In those instances, the underlayer can then be applied to the uppermost intermediate layer rather than to the substrate surface. Examples of possible intermediate layers that could be utilized include those selected from the group consisting of hard masks, organic layers, carbon layers, organo-metallic layers, and barrier layers.

Advantageously, the cured underlayer will be non-conducting. Furthermore, the crosslinked underlayer will be substantially insoluble in typical organic solvents such as ethyl lactate (EL), propylene glycol methyl ether acetate (PG-MEA), propylene glycol methyl ether (PGME), propylene glycol n-propyl ether (PnP), cyclohexanone, acetone, gamma butyrolactone (GBL), and mixtures thereof. Thus, when subjected to a stripping test, the crosslinked underlayers will have a percent stripping of less than about 5%, preferably less than about 1%, and even more preferably about 0%. The stripping test involves first determining the thickness (by taking the average of measurements at five different locations) of the cured underlayer. This is the initial average film thickness. Next, a solvent (e.g., ethyl lactate) is puddled onto the cured film for about 20 seconds, followed by spin drying at about 3,000 rpm for about 30 seconds to remove the solvent. The thickness is measured again at five different points on the wafer using ellipsometry, and the average of these measurements is determined. This is the average final film thickness.

The amount of stripping is the difference between the initial and final average film thicknesses. The percent stripping is:

$$\% \text{ stripping} = \left(\frac{\text{amount of stripping}}{\text{initial average film thickness}}\right) \times 100.$$

After the underlayer is cured, an EUV photoresist (i.e., imaging layer) can be applied to the underlayer to form a photoresist layer. One significant advantage of the present invention is that the photoresist composition can be selected without concern about modifying the photoresist composition to make it more suitable for EUV applications. For example, there is no need to incorporate a PAG functionality into the photoresist polymer, and in one embodiment, the photoresist polymer utilized is substantially free (i.e., less than about 0.1%, and preferably about 0%) of PAG functionality. It is also unnecessary to incorporate halogens into the photoresist composition, so that the photoresist composition can also be substantially free (i.e., less than about 0.1%, and preferably about 0%) of halogens, or at least of added halogens.

The photoresist layer can be formed by any conventional method, with one preferred method being spin coating the photoresist composition at speeds of from about 350 rpm to about 4,000 rpm (preferably from about 1,000 rpm to about 2,500 rpm) for a time period of from about 20 seconds to about 90 seconds (preferably from about 30 seconds to about 60 seconds). The photoresist layer is then preferably post-application baked ("PAB") at a temperature of at least about 90° C., preferably from about 100° C. to about 140° C., and more preferably from about 105° C. to about 130° C., and for time periods of from about 30 seconds to about 120 seconds. The thickness of the photoresist layer after baking will typically be from about 40 nm to about 120 nm, preferably from about 45 nm to about 80 nm, and more preferably from about 50 nm to about 70 nm.

The photoresist layer is subsequently patterned by exposure to EUV radiation for a dose of from about 5 mJ/cm$^2$ to about 100 mJ/cm$^2$, preferably from about 5 mJ/cm$^2$ to about 50 mJ/cm$^2$, and more preferably from about 5 mJ/cm$^2$ to about 15 mJ/cm$^2$, followed by development of the exposed photoresist layer. More specifically, the photoresist layer is exposed using a mask positioned above the surface of the photoresist layer. The mask has open areas designed to permit the EUV radiation to reflect from the mask and contact the surface of the photoresist layer. The remaining portions of the mask are designed to absorb the light to prevent the radiation from contacting the surface of the photoresist layer in certain areas. Those skilled in the art will readily understand that the arrangement of open areas and absorbing portions is designed based upon the desired pattern to be formed in the photoresist layer and ultimately in the substrate.

The present invention differs from the prior art in that it relies on using an external source of energy to improve resist performance. This concept is different from prior concepts that rely on changing the resist to achieve better LWR and sensitivity. Advantageously, as the photoresist layer is exposed to EUV radiation, the underlayer absorbance is modulated as a source of secondary electron generation. Because the resist and underlayer behave as a single layer in the inventive method, there are no reflection effects, and both materials absorb approximately the same amount of energy. The high-energy EUV photon, which has about 14 times the energy of that of the 193-nm wavelength, and the secondary electron generation enhance the photoresist's acid-generation efficiency, and therefore improve LWR and sensitivity.

After EUV exposure, the photoresist layer is preferably subjected to a post-exposure bake ("PEB") at a temperature of less than about 140° C., preferably from about 100° C. to about 140° C., and more preferably from about 105° C. to about 130° C., for a time period of from about 30 seconds to about 120 seconds (preferably from about 45 seconds to about 90 seconds).

The photoresist layer is then contacted with a developer to form the pattern. Depending upon whether the photoresist used is positive-working or negative-working, the developer will either remove the exposed portions of the photoresist layer, or remove the unexposed portions of the photoresist layer to form the pattern. The pattern is then transferred to the underlayer, any present intermediate layers, and finally the substrate. This pattern transfer can take place via a plasma etch process (e.g., $CF_4$ etchant, $O_2$ etchant). In embodiments where the pattern will be transferred from the photoresist layer to the substrate via etching, it is preferred that the etch selectivity of the underlayer relative to a typical BUY photoresist is at least about 1, and preferably from about 1.1 to about 2. These layers preferably etch equal to or more slowly than the substrate etches. That is, the substrate etch rate over the inventive composition etch rate will be from about 1 to about 5, and more preferably from about 1 to about 4 when the above etchants are used.

In one embodiment, the underlayer utilized can be developer soluble. "Developer soluble" or "wet-developable" as used herein means the portions of the underlayer that have been exposed to EUV radiation can be substantially removed with conventional aqueous developers such as tetramethyl ammonium hydroxide (TMAH) developers. The exposed portions of the underlayer underneath the exposed portions of the photoresist layer are removed by the developer as the photoresist layer is removed to form the desired pattern in the photoresist layer and the underlayer. The pattern can be via holes, trenches, lines, spaces, etc., that will ultimately be transferred to the substrate using an etch or ion implantation process. Preferably, at least about 95% of the exposed portions of the underlayer will be removed by the developer, more preferably at least about 99%, and even more preferably about 100% will be removed. Suitable developers are organic or inorganic alkaline solutions such as TMAH, and preferably comprise an aqueous solution of TMAH at a concentration of 0.26N or lower. Preferably, the dissolution rate of the underlayer in 0.26N TMAH developer will be from about 100 nm/second to about 1,000 nm/second, and even more preferably from 500 nm/second to about 1,000 nm/second. Conventional etching, metallization, etc., can then be carried out on the patterned stack to complete the device manufacture.

Regardless of whether pattern transfer is effected by etching or by developing, the resulting features have high resolutions. For examples, resolutions of less than about 32 nm, and preferably less than 22 nm can be achieved with the inventive method Compositions for Use in the Inventive Method The compositions used for the present process are preferably thermally crosslinkable. In more detail, the compositions preferably comprise a polymer, oligomer, and/or small molecule dissolved or dispersed in a solvent system. The compositions also preferably comprise a crosslinking agent or crosslinker dispersed or dissolved in the solvent system with the polymer, oligomer, or small molecule.

Preferred polymers, oligomers, and small molecules have a weight average molecular weight (Mw) of from about 500 to about 75,000 Daltons, and more preferably from about 1,000 to about 50,000 Daltons. Preferred polymers, oligomers, and small molecules include those selected from the group consisting of polymers, oligomers, and small molecules of acrylates, methacrylates, acrylic acids, styrenes, vinyls, epoxies, novolacs (e.g., phenol novolacs, epoxy novolacs), silanes, cyanurates, molecular glass (e.g., calixarene), and mixtures thereof. The polymer, oligomer, or small molecule is preferably present in the composition at a level of from about 50% to about 100% by weight, preferably from about 65% to about 100% by weight, and even more preferably from about 70% to about 99% by weight, based upon the total weight of solids in the composition taken as 100% by weight.

In a preferred embodiment, the composition also comprises aromatic moieties, such as anthracene groups. It is preferred that the moieties are attached to the polymer, oligomer, or small molecule.

In another preferred embodiment, the composition comprises halogen groups, such as bromine, fluorine, and chlorine. It is preferred that the halogens are provided as part of the polymer, oligomer, or small molecule.

In a particularly preferred embodiment, the composition includes both the aromatic moieties and the halogens, with anthracene and bromine being the most preferred of each.

In one embodiment, it is preferred that the compositions be organic in nature. It is also preferred that the compositions are substantially free of metal atoms and silicon atoms. That is, the composition will comprise less than about 1% by weight metal atoms, preferably less than about 0.05% by weight metal atoms, and preferably about 0% by weight metal atoms, based upon the total weight of the solids in the composition taken as 100% by weight.

In another embodiment, metal and/or silicon atoms can be provided in the composition, preferably as part of the polymer, oligomer, or small molecule. Preferred metals include those selected from the group consisting of the early transition metals (Groups MB and IVB), with Ti, Zr, and Hf being particularly preferred. In this embodiment, the total metal and silicon atoms present in the composition would be from about 4% to about 80% by weight metal, more preferably from about 20% to about 80% by weight metal, and even more preferably from about 60% to about 80% by weight metal, based upon the total solids in the composition taken as 100% by weight.

In some embodiments, a PAG is utilized. Preferably, the PAG is not attached to the polymer, oligomer, or small molecule, but instead is simply mixed into the underlayer composition. Preferred PAGs include those selected from the group consisting of: onium salts (e.g., triphenyl sulfonium perfluorosulfonates such as TPS nonaflate, TPS triflate, and substituted forms thereof, such as tris(4-tert-butylphenyl)sulfonium perfluoro-1-butanesulfonate (an alkyl-substituted TPS nonaflate), all available from Sigma-Aldrich); oximesulfonates (e.g., those sold under the name CGI® by CIBA); triazines (e.g., TAZ108® available from Midori Kagaku Company); and combinations thereof. The PAG should be present in the compositions at a level of from about 1% to about 10% by weight, and preferably from about 2% to about 6% by weight, based upon the total weight of the solids in the composition taken as 100% by weight.

In another embodiment, the underlayer composition is substantially free of any acid generator such as a PAG. That is, the underlayer composition will comprise less than about 0.001% by weight PAG, and preferably about 0% by weight PAG, based upon the total weight of the solids in the composition taken as 100% by weight.

Preferred crosslinkers are selected from the group consisting of vinyl ether crosslinkers, aminoplasts (e.g., sold under the name Powderlink® or Cymel®), epoxies, and mixtures thereof. An example of commercially-available vinyl ethers include those sold under the trade name VECTomer™ (Aldrich; St. Louis, Mo.). An example of suitable epoxies include those available under the name Araldite® (e.g., MY720 tetra functional epoxy resin) from Huntsman Advanced Materials. When utilized, the crosslinker is preferably present in the composition at a level of from about 0.01% to about 50% by weight, and preferably from about 0.01% to about 30% by weight, based upon the total weight of the solids in the composition taken as 100% by weight.

More preferably, the vinyl ether crosslinkers for use in the compositions have the formula $$R'—(X—O—CH=CH_2)_n,$$

where R' is selected from the group consisting of aryls (preferably $C_6$-$C_{14}$) and alkyls (preferably $C_1$-$C_{18}$, and more preferably $C_1$-$C_{10}$), each X is individually selected from the group consisting of alkyls (preferably $C_1$-$C_{18}$, and more preferably $C_1$-$C_{10}$), alkoxys (preferably $C_1$-$C_{18}$, and more preferably $C_1$-$C_{10}$), carbonyls, and combinations of two or more of the foregoing, and n is at least 2, and preferably from 2-6. The most preferred vinyl ethers include those selected from the group consisting of ethylene glycol vinyl ether, trimethylolpropane trivinyl ether, 1,4-cyclohexane dimethanol divinyl ether, and mixtures thereof.

In some embodiments, the composition for forming the underlayer comprises an acid catalyst. Preferred catalysts are selected from the group consisting of sulfonic acids (e.g., p-toluenesulfonic acid, styrene sulfonic acid), sulfonates (e.g., pyridinium p-toluenesulfonate, pyridinium trilluoromethanesulfonate, pyridinium 3-nitrobenzensulfonate), and mixtures thereof. The compositions can comprise from about 0.1% to about 2% by weight catalyst, and preferably from about 0.3% to about 1% by weight catalyst, based upon the total weight of solids in the composition taken as 100% by weight.

Preferred solvent systems include a solvent selected from the group consisting of PGMEA, PGME, PnP, EL, cyclohexanone, GBL, methyl isobutyl carbinol, and mixtures thereof. Preferably, the solvent system has a boiling point of from about 118-160° C., and more preferably from about 118-146° C. The solvent system should be utilized at a level of from about 97% to about 99.5% by weight, and preferably from about 98% to about 99% by weight, based upon the total weight of the composition taken as 100% by weight. The compositions used to form the underlayers will preferably comprise a solids content of from about 0.5% to about 3% by weight solids, and more preferably from about 1% to about 2% by weight solids, based upon the total weight of the composition taken as 100% by weight.

The underlayer composition is preferably formed by mixing the above ingredients together in the solvent system. Furthermore, any optional ingredients (e.g., surfactants) are also preferably dispersed in the solvent system at the same time.

EXAMPLES

The following examples set forth preferred methods in accordance with the invention. It is to be understood, however, that these examples are provided by way of illustration and nothing therein should be taken as a limitation upon the overall scope of the invention.

Example 1

Preparation of Coating Using Aliphatic Systems

A polyhydroxypropyl methacrylate was prepared by radical initiator using standard polymerization procedures. Formulation 1 was prepared for EUV lithography by adding 2.8 g of the polymer solution (19.58% wt/wt in PGME), 0.14 g of crosslinker (Powderlink® 1174, a crosslinking agent available from CYTEC Industries, West Paterson, N.J.), and 0.003 g of an acid catalyst (p-toluenesulfonic acid or "pTSA," available from Aldrich, St. Louis, Mo.) to a solvent mixture of 67.27 g of PGMEA (available from Harcross, St. Louis, Mo.) and 29.79 g of PGME (available from Harcross, St. Louis, Mo.).

This formulation was prepared again, this time substituting the polymer with a copolymer of vinyl naphthalene and methacrylic acid.

Example 2

Preparation of Coating Using Aromatic Polymers

Formulation 2, having 1% by weight total solids, was prepared as an underlayer coating for EUV lithography by combining 1.4 g of a phenol novolac polymer solution (which was in PGME), 0.5 g of a crosslinker (Powderlink® 1174), 0.1 g of an acid catalyst (pTSA). The resulting mixture was added to 196 g of a solvent mixture that was a 70:30 ratio of PGME to PGMEA.

Example 3

Preparation of Coating Using Linear Polyesters

A copolymer was prepared by condensing monoallyl diglycidyl cyanurate with hydroxy isophthalic acid in the presence of a phosphonium halide catalyst in PGME (20% solids solution). An underlayer coating (Formulation 3) was prepared for EUV lithography by adding 8.60 g of the co-polymer solution, 0.407 g of crosslinker, and 0.011 g of acid catalyst to a solvent mixture of 29.40 grams of PGMEA and 61.60 grams of PGME.

Example 4

Preparation of Coating Using Polymethacrylate System with Aromatic Units Attached Poly(2-hydroxy-propyl methacrylate-co-glycidyl methacrylate) was obtained from Nissan Chemical Industries, Japan in the form of a 20.3 wt % solution in PGME. This polymer solution as one starting material (59.897 g) was charged into a three-neck round-bottom flask equipped with a nitrogen inlet, a condenser, and a thermometer. Next, 6.601 g of 9-anthracenecarboxylic acid ("9-ACA," available from Harcross, St. Louis, Mo.) and 0.152 g of benzyl-triethyl ammonium chloride ("BTEAC," available from Aldrich, St. Louis, Mo.) were added to the solution. Then, 32.265 g of PGME was added to bring the total solids content to 20 wt %. The whole mixture was stirred to form a homogeneous solution, and then kept at 115±5° C. for 24 hours. The resultant polymer solution was characterized by Gel Permeation Chromatography (GPC) (MW=37.7 K Dalton, and Mn15.4 K Dalton), and used directly as the mother liquor (ML-4).

ML-4 (8.611 g), PowderLink® 1174 (0.407 g), pTSA (0.0112 g), PGME (61.6 g), and PGMEA (29.37 g) were mixed until homogeneous, and then filtered through a 0.1-µm end-point filter to produce Formulation 4.

Formulation 4 was formed into a 60-nm thick film on a silicon wafer by spin coating at 1,500 rpm for 60 seconds, followed by baking at 205° C. for 1 minute. The coated wafer was then rinsed with EL (available from Harcross, St. Louis, Mo.) and spun dry. The film thickness was measured again and compared to the initial thickness. The difference (referred to as "EL Stripping") was calculated to be within 0.5%, which means no obvious film loss or swelling occurred. This is a prerequisite for any underlayers that must remain intact during the resist coating. The water contact angle measurement of the resultant coating was determined using a VCA-3000S Wafer System, available from AST Products, Billerica, Mass. The coating of this Example had a water contact angle measurement of about 62, in the common working range. The water contact angle can be used as an indicator of surface energy compatibility with the resist, which, in turn, would affect the coating quality, adhesion, and litho performance of certain resists.

Various EUV resists have been tested on the underlayer coating prepared from Formulation 4. A resolution of about 26 nm ultimate resolution with about 4.2-4.5 nm line-width roughness (LWR) was achieved.

Figure 1:
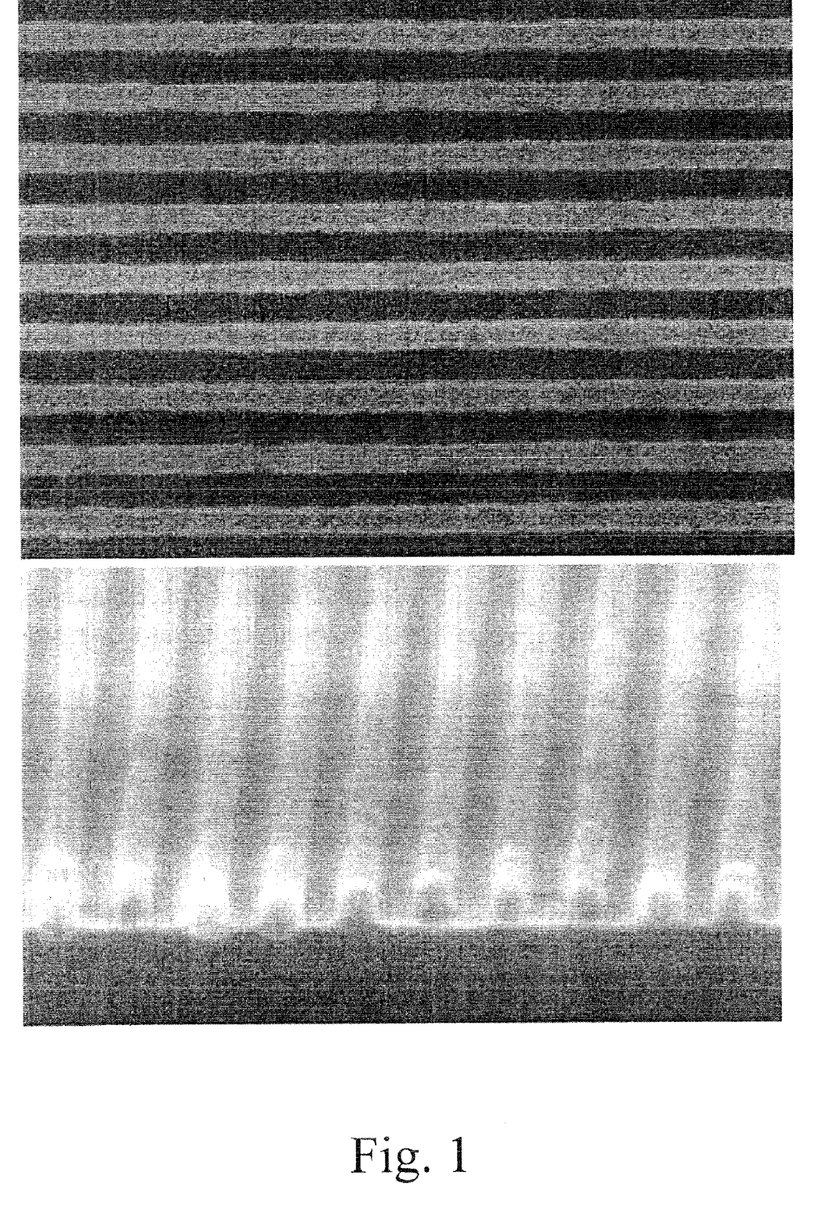
FIG. 1 is a scanning electron microscope (SEM) photograph (magnification 200,000) showing the lines created in the procedure described in Example 4.

In one of the tests, Formulation 4 was spin coated onto a silicon wafer at 1,500 rpm for 60 seconds, followed by baking at 205° C. for 60 seconds to form a film having a thickness of 60 nm. An EUV resist was applied to the film followed by exposure at 13.5 nm wavelength and developing with TMAH. As shown in FIG. 1, 30-nm, half-pitch lines were formed.

Example 5

Preparation of Coating Using Polymethacrylate System with Halogen Elements Integrated In this procedure, 130.385 g poly(2-hydroxy-propyl methacrylate-co-glycidyl methaerylate), 6.6 g of 9-ACA, and 8.788 g of 3,5-dibromobenzoic acid (available from Aldrich, St. Louis, Mo.) were mixed into a three-neck flask. Next, 0.33 g of BTEAC was added in as the catalyst, and 64.827 g of PGME was blended in, bringing the total solids content to 20 wt %. The whole reaction mixture was heated to 115±5° C. for 24 hours under a nitrogen environment. GPC analysis gave MW=64.0 K Dalton, and Mn=20.2 K Dalton. The solution was used directly as ML-5, without further purification.

ML-5 (5.0 g), PowderLink® 1174 (0.242 g), pTSA (0.00667 g), PGME (64.691 g), and PGMEA (29.40 g) were mixed until homogeneous, and then filtered through a 0.1-4 μm end-point filter to produce Formulation 5.

Figure 3:
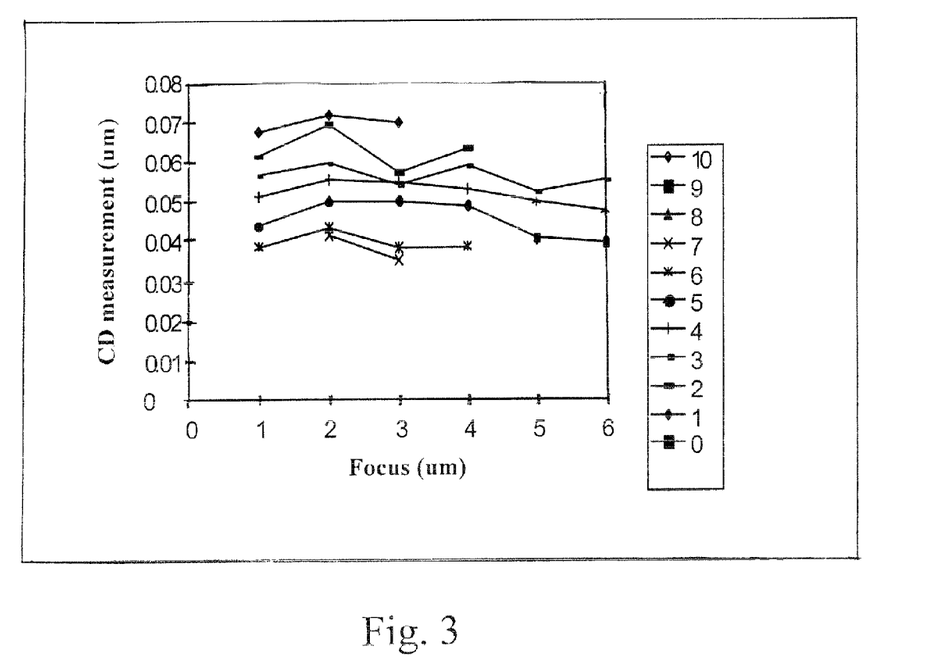
FIG. 3 shows the Bossung Plots of the formulation prepared in Example 5.

Formulation 5 was formed into a 20-nm thick film by spin coating at 1,500 rpm for 60 seconds, followed by baking at 205° C. for 1 minute. EL Stripping was measured to be within 0.5%, which means no obvious film loss or swelling. When tested with an EUV resist, the Bossung Plots of 50-nm, half-pitch ("HP") dense lines were as shown in FIG. 3.

Figure 2:
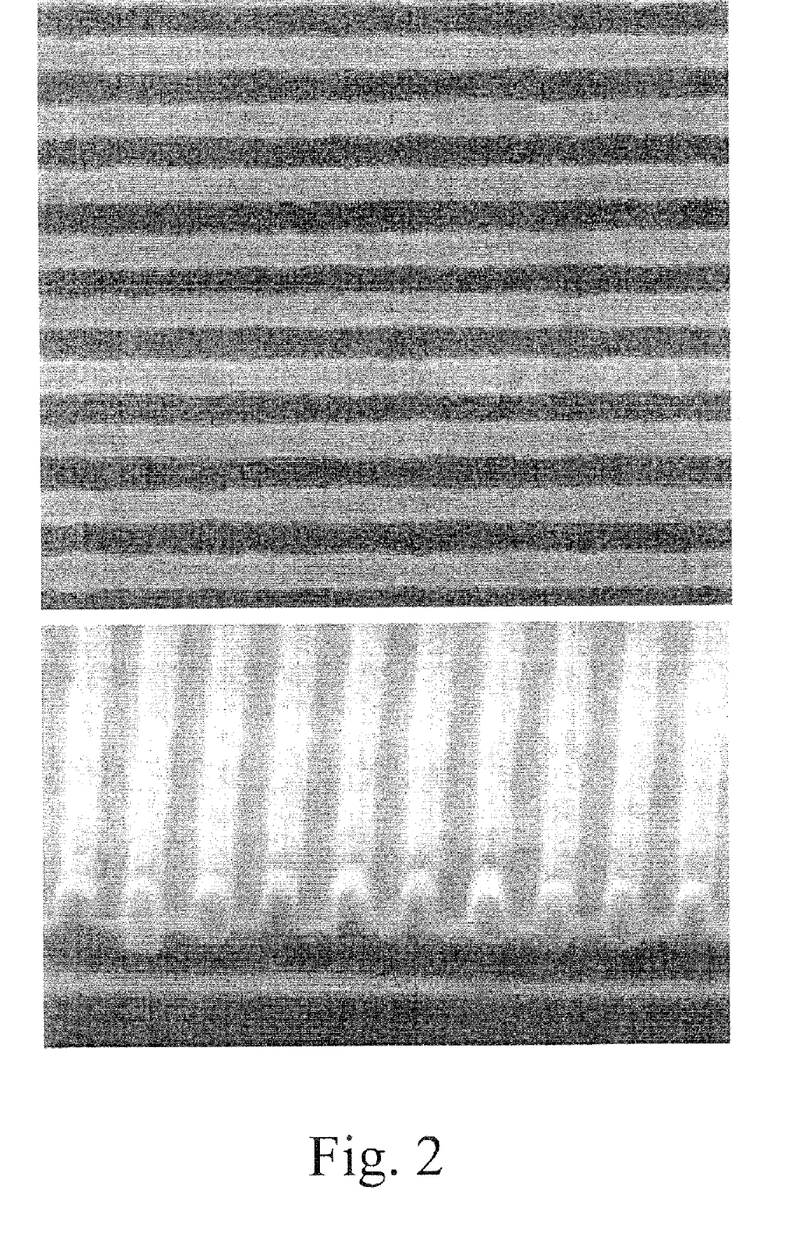
FIG. 2 is an SEM photograph (magnification 200,000) showing the lines created in the procedure described in Example 5.

In one of these tests, Formulation 5 was spin coated onto a silicon wafer at 1,500 rpm for 60 seconds, followed by baking at 205° C. for 60 seconds to form a film having a thickness of 20 nm. An EUV resist was applied to the film followed by exposure at 13.5 nm wavelength and developing with TMAH. As shown in FIG. 2, 30-nm half-pitch lines were formed.

Example 6

Preparation of Coating Using Methacrylate Copolymer

In this procedure, 7.5 g of methyl methacrylate (available from Aldrich, St. Louis, Mo.), 2.5 g of 2-hydroxy-propyl methacrylate (available from Polysciences, Warrington, Pa.), and 200 mg of azobisisobutyronitrile ("AIBN," available from Aldrich, St. Louis, Mo.) were dissolved in 89.8 g PGME. The solution was kept in an oil bath at 70-75° C. under a nitrogen environment for 16 hours. GPC analysis gave MW=22.3 K Dalton, and Mn=11.3 K Dalton). The solution was used directly as ML-6, without further purification.

ML-6 (16.0 g), PowderLink® 1174 (0.388 g), pTSA (0.0106 g), PGME (54.0 g), and PGMEA (29.4 g) were mixed until homogeneous, and then filtered through a 0.1-μm end-point filter to produce Formulation 6.

Formulation 6 was formed into a 60-nm thick film by spinning at 1,500 rpm for 60 seconds, followed by baking at 205° C. for 1 minute. EL Stripping was measured to be within 0.5%, which means no obvious film loss or swelling. The water contact angle measurement of the resultant coating was about 62.4, in the acceptable working range. Lithographic testing results with resists showed 28 nm ultimate resolution with about 4.4 nm LWR was achieved.

Example 7

Preparation of Coating Using Polymethacrylate System with Si-Containing Monomer In this procedure, 944 mg of styrene (available from Aldrich, St. Louis, Mo.), 3.47 g of methacrylic acid (available from Aldrich, St. Louis, Mo.), 5.586 g of POSS® methacrylate (available from Hybrid Plastics, Fountain Valley, Calif.), and 600 mg of AIBN were dissolved into 90 g of PGME. The solution was kept in oil bath at 70-75° C. under a nitrogen environment for 1.5 hours. GPC analysis gave MW=10.1 K Dalton, and Mn=6.0 K Dalton). The solution was used directly as ML-7, without further purification.

ML-7 (6.5 g), LIVELink™ (0.1625 g, a vinyl ether crosslinking agent available from Brewer Science Inc.), and PGME (43.34 g) were mixed until homogeneous, and then filtered through a 0.1-μm end-point filter to produce Formulation 7. This formulation was formed into a 60-nm thick film by spinning at 1,500 rpm for 60 seconds, followed by baking at 205° C. for 1 minute. EL Stripping was measured to be within 0.5%, which means no obvious film loss or swelling occurred.

Example 8

Preparation of Coating Using Sol-Gel Si Platform

In this procedure, 5.66 g of phenyl trimethoxysilane (available from Gelest, Morrisville, Pa.), 0.86 g of 2-(3,4-epoxy-cyclohexyl)ethyl trimethoxysilane (available from Gelest, Morrisville, Pa.), 34.44 g of methyltrimethoxysilane (available from Gelest, Morrisville, Pa.), 14.86 g of tetraethoxysilane (available from Gelest, Morrisville, Pa.), 5.64 g of acetic acid (available from Aldrich, St Louis, Mo.), 26.42 g of water, and 112.12 g of PGMEA were mixed and reacted at 90° C. under a nitrogen environment for 4 hours. By-products (water and methanol) were removed during the reaction. The final solution was used as ML-8 directly, without further purification.

ML-8 (19.22 g), 0.4 wt % BTEAC in PGME (2.5 g), PGME (46.64 g) and PGMEA (31.63 g) were mixed until homogeneous, and then filtered through a 0.1-μm end-point filter to produce Formulation 8.

Figure 4:
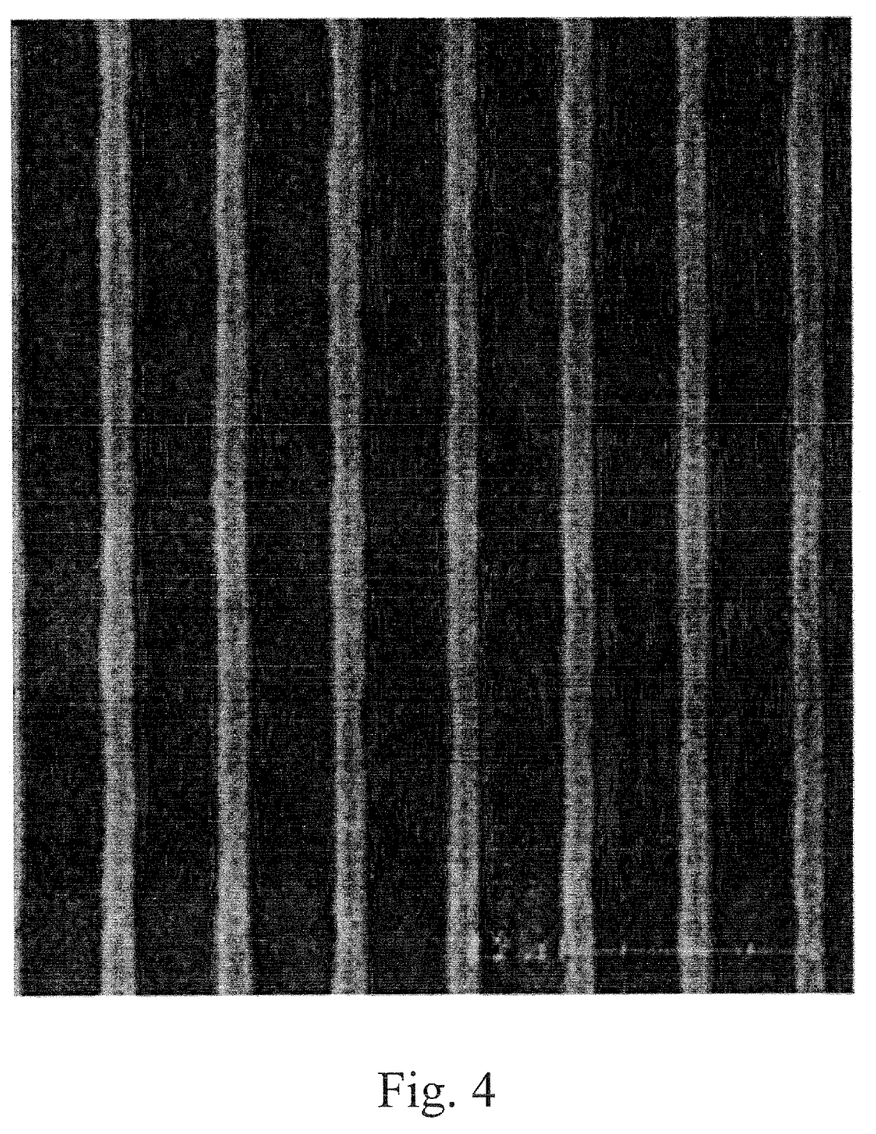
FIG. 4 is an SEM photograph (magnification 200,000) of a pattern formed using the formulation of Example 8.

Formulation 8 was formed into a 20-nm thick film by spin coating at 3,000 rpm for 60 seconds, followed by baking at 205° C. for 1 minute. EL Stripping was measured to be within 0.5%, which means no obvious film loss or swelling occurred. When tested with an ArF resist (TARE Pi6-001, available from TOK, Japan) on top using an ArF scanner, around 20-nm lines could be printed by overdosing 50-nm half-pitch, dense lines, as shown in FIG. 4.

Example 9

Preparation of Coating Using Sol-Gel Ti Platform

In this procedure, 3.5 g of TYZOR AA-105 (a titanium-based, sol-gel precursor, available from Dupont), 12.5 g of PGMEA, and 34 g of PGME were mixed until homogeneous, and then filtered through a 0.1-μm end-point filter to produce Formulation 9. This formulation was formed into 60-nm thick film by spin coating at 1,500 rpm for 60 seconds, followed by baking at 20° C. for 1 minute. EL Stripping was measured to be within 0.5%, which means no obvious film loss or swelling occurred.

Figure 5:
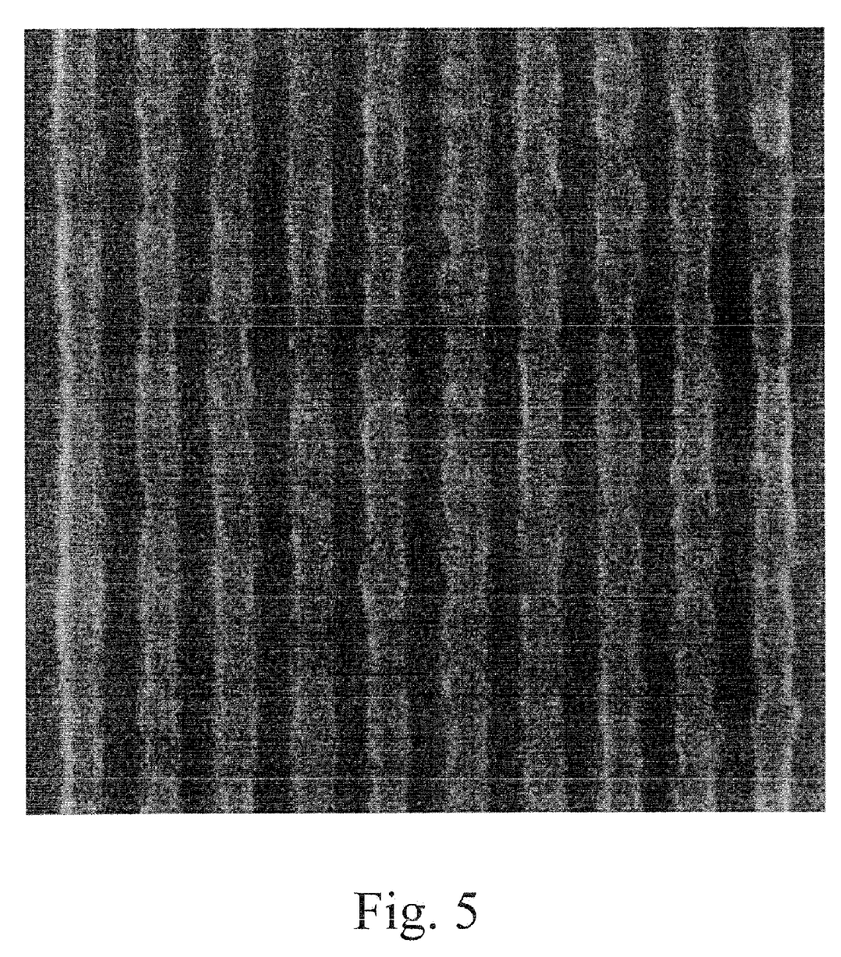
FIG. 5 is an SEM photograph (magnification 200,000) of a pattern formed using the formulation of Example 9.

Formulation 9 was coated on a silicon-primed wafer to render 60-nm underlayer film, before an EUV resist (EUV-P1123, available from TOK, Japan) was coated on top. The wafer was exposed with an EUV source. FIG. 5 shows 30-nm, half-pitch, dense line patterning, with an LWR of 4.33 nm.

Example 10

Preparation of Coating Using Novolac System

In this procedure, 10 g of ECN1299 (an epoxy novolac resin, available from Dow Chemicals, Midland, Mich.), 0.1 g of TAG2689 (a thermal acid generator, available from King Industries, Norwalk, Conn.), 72 g of PGMEA, and 17.75 g of PGME were mixed until homogeneous, and then filtered through a 0.1-μm end-point filter to produce ML-10.

ML-10 (21 gram), 55.86 grams of PGME and 23.94 grams of PGMEA were mixed until homogeneous, and then filtered through a 0.1-μm end-point filter to produce Formulation 10. Formulation 10 was formed into a 60-nm thick film by spin coating at 1,500 rpm for 60 seconds followed by baking at 205° C. for 1 minute. EL Stripping was measured to be within 0.5%, which means no obvious film loss or swelling occurred. Lithographic testing results with resists showed that 26-nm ultimate resolution with approximately 4.2 nm LWR could be obtained.

Example 11

Preparation of Coating Using Novalac

System With Aromatic Units Attached

In this procedure, 4.0614 g of ECN1299, 3.8402 g of 9-ACA, and 0.0984 g of BTEAC was dissolved into 32.0 g of PGME. The whole reaction mixture was heated to 120±5° C. for 24 hours under a nitrogen environment. GPC analysis gave MW=3.8 K Dalton, and Mn=1.6 K Dalton). The solution was used directly as ML-11, without further purification.

Next, ML-11 (7.445 g), PowderLink® 1174 (0.194 g), pTSA (0.0194 g), PGME (22.202 g), ethyl lactate (44.27 g), and cyclohexanone (8.0492 g) were mixed until homogeneous, and then filtered through a 0.1-µm end-point filter to produce Formulation 11. This formulation was formed into a 60-nm thick film by spin coating at 1,500 rpm for 60 seconds followed by baking at 205° C. for 1 minute. EL Stripping was measured to be within 0.5%, which means no obvious film loss or swelling occurred.

Example 12

Preparation of Coating Using System with Free Epoxy Available

In this procedure, 32.597 g of poly(2-hydroxy-propyl methacrylate-co-glycidyl methacrylate), 1.6505 g of 9-ACA, and 0.0825 g of BTEAC were mixed into a three-neck flask, and 14.02 g of PGME were blended in, bringing the total solids content to 20 wt %. The whole reaction mixture was heated to 115±5° C. for 24 hours under a nitrogen environment. The solution was used directly as ML-12, without further purification.

ML-12 (8.611 g), PowderLink® 1174 (0.407 g), pTSA (0.0112a, PGME (61.6 g), and PGMEA (29.37 g) were mixed until homogeneous, and then filtered through a 0.1-µm endpoint filter to produce Formulation 12. This formulation was formed into a 60-nm thick film by spin coating at 1,500 rpm for 60 seconds, followed by baking at 205° C. for 1 minute. EL Stripping was measured to be within 0.5%, which means no obvious film loss or swelling occurred.

We claim:
1. A method of forming a structure, said method comprising:
providing a substrate including one or more intermediate layers thereon, one of said intermediate layers being the uppermost intermediate layer, and said uppermost intermediate layer being a carbon layer;
forming an underlayer on said uppermost intermediate layer, said underlayer having a thickness of at least about 10 nm;
forming a photoresist layer on said underlayer; and
subjecting at least a portion of said photoresist layer to EUV radiation.
2. The method of claim 1, wherein said substrate is selected from the group consisting of silicon, SiGe, $SiO_2$, $Si_3N_4$, aluminum, tungsten, tungsten silicide, gallium arsenide, germanium, tantalum, and tantalum nitride.

3. The method of claim 1, wherein said forming an underlayer comprises:
spin coating a composition on said uppermost intermediate layer; and
baking said composition to form said underlayer.
4. The method of claim 1, wherein said underlayer is formed from a composition comprising a polymer, oligomer, and/or small molecule dispersed or dissolved in a solvent system.
5. The method of claim 4, wherein said composition comprises less than about 1% by weight metal atoms, based upon the total weight of the solids in the composition taken as 100% by weight.
6. The method of claim 4, wherein said polymer, oligomer, and/or small molecule is selected from the group consisting of polymers, oligomers, and small molecules of acrylates, methacrylates, acrylic acids, styrenes, vinyls, epoxies, novolacs, silanes, cyanurates, molecular glass, and mixtures thereof.
7. The method of claim 4, wherein said composition further comprises a crosslinking agent.
8. The method of claim 4, wherein said underlayer is formed from a composition that comprises a photoacid generator that is not attached to the polymer, oligomer, or small molecule.
9. The method of claim 1, wherein said subjecting said photoresist layer to EUV radiation is carried out with a dose of from about 5 $mJ/cm^2$ to about 100 $mJ/cm^2$.
10. The method of claim 1, further comprising forming a pattern in said photoresist layer after said subjecting said photoresist layer to EUV radiation.
11. The method of claim 10, further comprising transferring said pattern to said underlayer; to said intermediate layers; and to said substrate.
12. The method of claim 11, wherein said transferring said pattern comprises etching said underlayer; intermediate layers; and said substrate.
13. The method of claim 11, wherein said pattern has a resolution of less than about 32 nm.
14. The method of claim 10, wherein said forming a pattern in said photoresist layer comprises contacting said photoresist layer with a developer so as to remove some of said photoresist layer.
15. The method of claim 1, wherein said photoresist layer is formed from a composition comprising a polymer, oligomer, and/or small molecule dispersed or dissolved in a solvent system, said polymer, oligomer, and small molecule being substantially free of photoacid generator functionalities.
16. The method of claim 1, wherein said underlayer is non-conductive.
17. The method of claim 1, wherein said underlayer is formed from a composition that is substantially free of photoacid generators.
18. A method of forming a structure, said method comprising:
providing a substrate including one or more intermediate layers thereon, one of said intermediate layers being the uppermost intermediate layer, and said uppermost intermediate layer being a carbon layer;
forming an underlayer on said uppermost intermediate layer, said underlayer being non-conductive;
forming a photoresist layer on said underlayer; and
subjecting at least a portion of said photoresist layer to EUV radiation.
19. The method of claim 18, wherein said substrate is selected from the group consisting of silicon, SiGe, $SiO_2$, Si₃N₄, aluminum, tungsten, tungsten silicide, gallium arsenide, germanium, tantalum, and tantalum nitride.

20. The method of claim 18, wherein said forming an underlayer comprises:
   spin coating a composition on said uppermost intermediate layer; and
   baking said composition to form said underlayer.

21. The method of claim 18, wherein said underlayer is formed from a composition comprising a polymer, oligomer, and/or small molecule dispersed or dissolved in a solvent system.

22. The method of claim 21, wherein said composition comprises less than about 1% by weight metal atoms, based upon the total weight of the solids in the composition taken as 100% by weight.

23. The method of claim 21, wherein said polymer, oligomer, or small molecule is selected from the group consisting of polymers, oligomers, and small molecules of acrylates, methacrylates, acrylic acids, styrenes, vinyls, epoxies, novolacs, silanes, cyanurates, molecular glass, and mixtures thereof.

24. The method of claim 21, wherein said composition further comprises a crosslinking agent.

25. The method of claim 21, wherein said underlayer is formed from a composition that comprises a photoacid generator that is not attached to the polymer, oligomer, or small molecule.

26. The method of claim 18, wherein said subjecting said photoresist layer to EUV radiation is carried out with a dose of from about 5 mJ/cm² to about 100 mJ/cm².

27. The method of claim 18, further comprising forming a pattern in said photoresist layer after said subjecting said photoresist layer to EUV radiation.

28. The method of claim 27, further comprising transferring said pattern to said underlayer; to said intermediate layers; and to said substrate.

29. The method of claim 28, wherein said transferring said pattern comprises etching said underlayer; intermediate layers; and said substrate.

30. The method of claim 28, wherein said pattern has a resolution of less than about 32 nm.

31. The method of claim 27, wherein said forming a pattern in said photoresist layer comprises contacting said photoresist layer with a developer so as to remove some of said photoresist layer.

32. The method of claim 18, wherein said photoresist layer is formed from a composition comprising a polymer, oligomer, and/or small molecule dispersed or dissolved in a solvent system, said polymer, oligomer, and small molecule being substantially free of photoacid generator functionalities.

33. The method of claim 18, wherein said underlayer is formed from a composition that is substantially free of photoacid generators.

34. A method of forming a structure, said method comprising:
   providing a substrate, said substrate optionally including one or more intermediate layers thereon;
   forming an underlayer on said substrate, or on said one or more intermediate layers, if present, said underlayer having a thickness of at least about 10 nm, wherein said underlayer is formed from a composition comprising a photoacid generator and a polymer, oligomer, and/or small molecule dispersed or dissolved in a solvent system, wherein said photoacid generator is not attached to the polymer, oligomer, or small molecule;
   forming a photoresist layer on said underlayer; and
   subjecting at least a portion of said photoresist layer to EUV radiation.

35. A method of forming a structure, said method comprising:
   providing a substrate, said substrate optionally including one or more intermediate layers thereon;
   forming an underlayer on said substrate, or on said one or more intermediate layers, if present, said underlayer being non-conductive, wherein said underlayer is formed from a composition comprising a photoacid generator and a polymer, oligomer, and/or small molecule dispersed or dissolved in a solvent system, wherein said photoacid generator is not attached to the polymer, oligomer, or small molecule;
   forming a photoresist layer on said underlayer; and
   subjecting at least a portion of said photoresist layer to EUV radiation.

* * * * *